United States Patent
Westphal et al.

(10) Patent No.: US 6,884,496 B2
(45) Date of Patent: Apr. 26, 2005

(54) METHOD FOR INCREASING COMPRESSION STRESS OR REDUCING INTERNAL TENSION STRESS OF A CVD, PCVD OR PVD LAYER AND CUTTING INSERT FOR MACHINING

(75) Inventors: Hartmut Westphal, Dermbach/Rhön (DE); Volkmar Sottke, Mülheim (DE)

(73) Assignee: Widia GmbH, Essen (DE)

(*) Notice: Subject to any disclaimer, the term of this patent is extended or adjusted under 35 U.S.C. 154(b) by 3 days.

(21) Appl. No.: 10/257,998

(22) PCT Filed: Dec. 22, 2001

(86) PCT No.: PCT/DE01/04952

§ 371 (c)(1),
(2), (4) Date: Oct. 16, 2002

(87) PCT Pub. No.: WO02/077312

PCT Pub. Date: Oct. 3, 2002

(65) Prior Publication Data

US 2003/0104254 A1 Jun. 5, 2003

(30) Foreign Application Priority Data

Mar. 27, 2001 (DE) .......................................... 101 15 201
May 15, 2001 (DE) .......................................... 101 23 554

(51) Int. Cl.$^7$ .......................... C23C 14/58; C23C 16/56
(52) U.S. Cl. .................. 428/216; 427/348; 427/355; 428/336; 428/472; 428/698; 428/701
(58) Field of Search .................................. 427/348, 355; 428/216, 336, 698, 472, 701

(56) References Cited

U.S. PATENT DOCUMENTS

| | | | |
|---|---|---|---|
| 5,250,367 A | * | 10/1993 | Santhanam et al. ............ 51/307 |
| 5,318,840 A | | 6/1994 | Ikeda et al. |
| 5,395,680 A | * | 3/1995 | Santhanam et al. .......... 428/698 |
| 5,576,093 A | * | 11/1996 | Yoshimura et al. .......... 428/698 |
| 5,597,272 A | * | 1/1997 | Moriguchi et al. .......... 407/119 |
| 5,861,210 A | * | 1/1999 | Lenander et al. ........ 427/419.1 |
| 6,090,476 A | | 7/2000 | Thysell et al. |
| 6,187,421 B1 | * | 2/2001 | Moriguchi et al. ............ 51/307 |

FOREIGN PATENT DOCUMENTS

| | | |
|---|---|---|
| DE | 197 19 195 | 11/1998 |
| DE | 196 2 872 | 7/2000 |
| EP | 416824 | * 3/1991 |
| EP | 0 727 510 | 8/1996 |
| JP | 02254144 | 10/1990 |
| JP | 06-057409 | * 3/1994 |
| JP | 06-079502 | * 3/1994 |
| WO | WO 92/05296 | 4/1992 |
| WO | WO 98/16665 | 4/1998 |
| WO | WO 99/23275 | 5/1999 |
| WO | WO 00/73532 | 12/2000 |

OTHER PUBLICATIONS

"Effects of Shot Peening on CVD–Coated Cemented Carbide" by Sato et al., published Nov. 7, 1993.

* cited by examiner

Primary Examiner—Archene Turner
(74) Attorney, Agent, or Firm—Herbert Dubno

(57) ABSTRACT

A method of increasing the compressive stress or of reducing the tensile residual stress of a CVD layer, a PCVD layer or PVD layer and a cutting insert for machining.

The invention relates to a method of increasing the compressive residual stress or of reducing the tensile residual stress of a hard material outer layer or a hard material outermost layer in which the coated substrate after coating is subjected to a dry blast treatment using a granular blast agent that, according to the invention, has a maximum diameter of 150 μm.

10 Claims, No Drawings

METHOD FOR INCREASING COMPRESSION STRESS OR REDUCING INTERNAL TENSION STRESS OF A CVD, PCVD OR PVD LAYER AND CUTTING INSERT FOR MACHINING

CROSS REFERENCE TO RELATED APPLICATIONS

This application is a national stage of PCT/DE 01/04952 filed 22 Dec. 2001 and is based upon German national application 101 15 201.9 filed 27 Mar. 2001 and 101 23 554.2 of 15 May 2001 under the International Convention.

FIELD OF THE INVENTION

The invention relates to a method of increasing the compressive residual stress or intrinsic stress or for reducing the tensile residual stress intrinsic stress of a hard material layer coated as an outer layer or as the outermost layer of a hard metal substrate body, a cermet substrate body or a ceramic substrate body by means of CVD, PCVD or PVD, in which the coated substrate body subsequent to the coating is subjected to a dry blast treatment utilizing a blast agent in particle form.

The invention also relates to a cutting insert for machining which is comprised of a hard metal substrate, a cermet substrate or a ceramic substrate body with a coating having one layer or a plurality of layers of carbides, nitrides, carbonitrides. oxycarbonitrides and/or borides of the elements of Groups IVa to VIa of the periodic system, boron-containing hard material compounds and/or oxidic compounds of aluminum and/or zirconium, which are applied by means of a PCVD process or a CVD process.

BACKGROUND OF THE INVENTION

Hard metals comprise a binder phase composed of cobalt and/or nickel and a hard material phase which can have, for example, WC, TiC, TaC, NbC, VC and/or $Cr_3C_2$.

Such hard metals are differentiatable from cermets by having a greater proportion of a TiCN phase and include other carbides and/or nitrides. Binder metals also include the elements of the iron group, usually Co and/or Ni.

Ceramics, especially for machining purposes are comprised usually of $Al_2O_3$ and/or $ZrO_2$. Depending upon the machining operation and the workpiece to be machined, the wear-resistance and useful life can be increased by single-layer or multilayer coatings of the above-mentioned compositions. The coating can be applied by means of a physical vapor deposition process (PVD) or a chemical vapor deposition process (CVD) whereby the CVD process or—in a further development—a so-called plasma supported CVD process (PCVD) has the advantage of uniform coverage which avoids the shading effects arising with the PVD process.

The microstructure, the residual stresses or intrinsic stresses and the adhesion stability of single-layer or multilayer coatings is strongly dependent on the coating process used and the coating parameters employed. In the techniques common in the past, CVD deposited coatings as a rule showed tensile stresses while those coatings deposited by PVD processes were characterized by compressive stresses. To improve the resistance to breaking it has-been proposed, for example, in WO 92/05296 to combine a CVD layer or a plurality of CVD layers with one or more layers deposited by PVD, whereby as the material for the internal layers deposited by CVD, nitrides of titanium, hafnium and/or zirconium were used and for the layers deposited by means of PVD, nitrides and carbonitrides of the mentioned metals were proposed. Disadvantageously, however, such a coating requires different apparatuses and both involve considerable work and is costly.

In DE 197 19 195 A1 it has been proposed to deposit a multilayer coating by an uninterrupted CVD process at temperatures between 900° C. and 1100° C. by alteration of the gas composition from time to time. The outer coating (cover layer) is comprised of a single phase or multiphase layer of carbides, nitrides or carbonitrides on a Zr or Hf basis which is deposited by means of CVD and has intrinsic compressive strength and an underlying layer or layers also applied by CVD and exclusively with intrinsic tensile stress whereby at least one underlying layer or the single underlying layer is comprised of TiN, TiC and/or Ti (C,N). The compressive stresses measured in the outermost layer or the outer layer lies between −500 and −2500 MPa (compressive stresses are defined with negative values by comparison with tensile stresses for which positive values are used).

According to the state of the art it is further known to subject coated substrate bodies after coating to a surface treatment. Current mechanical treatment methods are brushing and blast treatment in which the blast agents used are ball-shaped particles with a grain size from 300 $\mu$m to 600 $\mu$m directed against the surface by means of compressed air at a pressure of $2\times10^5$ to $4\times10^5$ Pa. Such a surface treatment increases the compressive residual stress of the outermost layer by slight hardening. In this manner detrimental crack formation and spreading, corrosion and peeling or chipping reactions are encountered.

OBJECT OF THE INVENTION

It is the object of the present invention to increase the resistance to crack formation, corrosion resistance and wear resistance of coated composite materials, especially cutting bodies by appropriate means and to obtain an improved cutting insert.

SUMMARY OF THE INVENTION

These objects are achieved according to the invention, in that the blast agent has a maximum diameter of 150 $\mu$m, preferably a maximum of 100 $\mu$m. The use of such fine grain blast agents, which are used dry without water or other liquid additives, gives rise to surprising results in that the abrasive stresses of the outer layer are increased by significant levels and to the extent that the outer layers have residual tensile stresses, the tensile stresses by the dry blast treatment can be significantly minimized to the point that there is a reversal into a compressive stress in the outer layer. Depending upon the duration of the intensity of the blast treatment, there is also a change in the intrinsic stress of the layers lying below the cover layer up to the point that the boundary zones adjacent the substrate body are affected in an identical manner. In the ideal case, a composite body with a multilayer coating can be produced by the outer mechanical blast treatment whose layers have exclusively compressive residual or intrinsic stresses, whereby the cover layer manifests intensive consolidation and thus enhanced wear-resistance. The fine grain, powder-like blast agents are substantially not abrasive or they at least significantly reduce abrasiveness by comparison with the coarser grains hitherto used in accordance with the state of the art. A further advantage of this dry blast treatment is that the layer surface is significantly better smoothed than the surfaces from earlier blast treatments or brushing.

In WO 99/23275, there is indeed described the use of Al$_2$O$_3$ particles with a particle size of 30 μm as a blast agent, but this blast agent is intended to be used in the form of a suspension as a wet blast agent which is applied under a pressure of 2 to 6 bar (×10$^5$ Pa), preferably 3 bar. The there-described wet blast treatment is applied, however, exclusively to a specific layer sequence with a lower Al$_2$O$_3$ layer upon which an outer layer is applied which is comprised of TiN or a multilayer coating of TiN/TiC. The CVD process used for the coating gives rise evidently to (tensile) stresses which are intended to be minimized by means of the wet blast treatment. The wet blast treatment with an Al$_2$O$_3$ abrasive agent serves therefore primarily for surface smoothing, so that the change in the residual stress, by comparison with a dry blast treatment is clearly minimal.

This should be also clear from the fact that in this publication, mention is made of the fear that a TiN layer deposited directly upon the Al$_2$O$_3$ layer has only a slight adhesion for which reason advantageously an intermediate layer of (Ti,Al) (C,O,N) is preferred.

A corresponding understanding applies as well for EP 0 727 510 A2 which describes the wet blast treatment of an aluminum oxide coating. The K-aluminum oxide present on the surface should be heat-treated at a temperature of 9000 to 1100° C. for 0.3 to 10 hours in order to convert the wet blast treated κ-aluminum oxide into α-aluminum oxide.

Thus the blast agent consists at least in substantial part of a round granular form whose diameter preferably is between 5 to 150 μm and even more preferably between 10 to 100 μm. With larger grains, respectively, there is the danger of a greater abrasion of the applied cover layer until the completely undesired removal of this outer cover layer as well as the underlying layers bounding same. With smaller blast agent grains, there is a significant reduction in the abrasive effectiveness of the dry blast agent treatment.

The blast agent is preferably pressure atomized or dispersed steel, a cast iron granulate, heavy metal powders or alloys or hard metal granulates or break-resistant ceramics. These blast agents have a high resistance to breakdown so that a rupture of the grains to sharp-edged smaller grains which can greatly increase the damage to the composite body surface, will be avoided.

According to a further characteristic of the invention, the blast agent is directed onto the coated substrate body by means of compressed air under a pressure of at least 5×10$^5$ Pa to a maximum of 10$^6$, preferably between 6×10$^5$ Pa to 7×10$^5$ Pa. The blast pressure used is significantly above that usually employed in the state of the art (with use of a coarse-grained blast agent).

Basically it is also possible to direct the blast agent onto the composite body surface at optional angles, although the effect is enhanced when the blast agent is trained substantially perpendicularly to the composite body surface.

According to a further feature of the invention, the blast treatment is carried out for a sufficient time for a layer beneath the outer layer or beneath the outermost layer and preferably a layer which is in the zone proximal to the substrate body to be subjected to a change of the residual stress, i.e. either an increase in the compressive stress or a minimization of the tensile stress. By a corresponding choice of the blast pressure and treatment duration, the intrinsic stresses of the layers which lie below the cover layer can be influenced in a targeted manner.

Surprisingly a cutting insert can achieve significantly improved life in machining. It is first to be noted that in an outer layer or the outermost layer which can be applied by PCVD or CVD, compressive residual stresses can be generated which are ≧4 GPa, preferably 4.5 to 10 GPa. Such compressive residual stresses could have been achieved heretofore with PVD layers which are after-treated.

The substrate body can be a hard metal, a hard metal with an edge-zone gradient, a cermet or an oxide ceramic or nitride ceramic. The substrate bodies are preferably coated with a coating of carbides, nitrides, carbonitrides, oxycarbonitrides and/or borides of the elements of Groups IVa to VIa of the periodic system, boron-containing hard material compounds and/or oxidic compounds of aluminum and/or zirconium. The layer thickness of an individual layer lies between 0.1 μm and a maximum of 10 μm. The total layer thickness of a multilayer coating should preferably be ≧20 μm.

The residual compressive stress is measured röntgenographically according to the sin$^2$ψ method. The method is, for example, described in the publication HTM43 (1988) 4, pages 208 to 211, "Röntgenographische Eigenspannungsmessungen an texturbehafteten PVD-Schichten aus Titancarbid" by B. Eigenmann, B. Scholtes and E. Macherauch (x-ray Residual Stress Measurements on Texture Adherent PVC Layers of Titanium Carbide).

The residual stress values measured in accordance with the invention are thus reached at least one lattice plane. The proposed blast treatment encompasses at least the entire cutting range used for the respective machining operation of a cutting insert.

The invention is described in greater detail in the following in connection with examples:

EXAMPLE 1

Cutting bodies of the type CNMG 120412 with chip-forming grooves for average to average heavy cutting requirements of P 20 hard metal (WC/TaC/NbC/TiC/7.5% Co) with mixed-carbide-free edge zones and a CVD coating beginning at the substrate of TiN—TiCN(MT CVD)—Al$_2$O$_3$—ZrCN with a total coating thickness of 18 μm, were subjected after the coating to a dry blast treatment utilizing an injector, gravitation blasting with zirconium oxide ceramic granulate, pressure atomized steel powder and sintered hard metal spray-formed granules. The residual stress was determined by the sin$^2$ψ method röntgendiffractometrically on each of at least two lattice planes. The average values thereof are given in Table 1. They were also tested in a turning test with a strong interrupted cut (bar-turning test) on martensitic stainless steel for cutting capacity (v=150 m/min, a$_p$=2.0 mm, f=0.35 mm/U):

TABLE 1

| Blast Agent | Pressure [bar] | Duration [sec] | Grain Size [μm] | Residual Stress in WC [GPa]* | Residual Stress in TiCN/Al$_2$O$_3$/ZrCN [GPa] | Number of Cuts |
| --- | --- | --- | --- | --- | --- | --- |
| — | — | — | — | −0.15 | +0.8/+0.4/−1.0 | 2600 |
| Zirconiumoxide Ceramic | 4.5 | 60 | 60–120 | −0.4 | −0.5/−2.6/−4.4 | 4200 |

TABLE 1-continued

| Blast Agent | Pressure [bar] | Duration [sec] | Grain Size [μm] | Residual Stress in WC [GPa]* | Residual Stress in TiCN/Al₂O₃/ZrCN [GPa] | Number of Cuts |
|---|---|---|---|---|---|---|
| Pressure Atomized Steel Powder | 6.5 | 30 | 50–100 | −0.8 | −1.1/−3.6/−7.0 | 5500 |
| Hard Metal granulate | 6.0 | 30 | 50–80 | −1.0 | −1.7/−4.3/−8.7 | 5900 |

*Sign + Stands for tensile residual stress − Stands for compressive residual stress

EXAMPLE 2

To improve the smoothing effect, for the steel treatment with the hard metal granulate according to the foregoing Table, about 5% of cast hard metal chips in a grain size of 50–100 μm was added as an abrasively effective component. Under the same conditions as were described for hard metal granulate above, the roughness depth was reduced by about ⅓. The change in the residual stress was not influenced thereby.

EXAMPLE 3

Cutting bodies of the type SEKN 1203 AF.N with peripheral chip surface bevel (15°/0.2 mm) of K 20 hard metal (WC/6.2% Co) were used. The cutting bodies had CVD coatings beginning at the substrate of TiN—TiCN(MT CVD)—Al₂O₃—TiN with a total thickness of 11 μm. After coating they were subjected to a dry blast treatment in accordance with the injector-gravitation blast process with steel grit, hard metal granulate and tungsten metal powder as described in Example 1, the residual stress was determined and the cutting inserts were tested for edge retention in a single-tooth milling test (planar milling) on spherical graphite cast iron GGG60 (v=250 m=min, $a_p$=2.0 mm, $f_x$=0.25 mm/tooth, $v_f$=200 mm/min) (see Table 2):

TABLE 2

| Blast Agent | Pressure [bar] | Duration [sec] | Grain Size [μm] | Residual Stress in WC [GPa]* | Residual Stress in TiCN/Al₂O₃/TiN [GPa] | Milling Path [mm] |
|---|---|---|---|---|---|---|
| — | — | — | — | −0.2 | +0.9/+0.6/+1.0 | 1800 |
| Tungsten Powder | 6.0 | 45 | 30–75 | −0.7 | −0.5/−1.8/−4.9 | 4000 |
| Steel Grit | 6.5 | 30 | 60–120 | −0.8 | −0.9/−2.5/−4.3 | 3500 |
| Hard Metal granulate | 7.5 | 30 | 50–80 | −0.9 | −1.2/−4.0/−5.8 | 4900 |

*Sign + Stands for tensile residual stress − Stands for compressive residual stress The foregoing Tables show that a dry blast treatment effects a significant improvement in the life of the cutting body. The best results are achieved with pressure-atomized steel powder, hard metal granulate and tungsten powder.

What is claimed is:

1. A method of increasing the compressive residual stress or of reducing the tensile residual stress of an outer hard material layer or an outermost hard material layer, comprising the steps of:

applying at least one hard material layer as said outer or outermost layer by means of CVD, PCVD or PVD to a hard metal substrate body, a cermet substrate body or a ceramic substrate body;

subjecting the coated substrate body after coating to a dry blast treatment using spray-formed hard metal granulate as a granular blast agent in the form of round grains with a maximum diameter of 150 μm.

2. The method according to claim 1 wherein the blast agent has grains of a maximum diameter of 100 μm.

3. The method according to claim 1 wherein the hard metal granulate has a particle size of 10 to 100 μm.

4. The method according to claim 1 wherein the blast agent is directed by compressed air at a pressure of at least 5×10⁵ Pa to a maximum of 10⁶ Pa onto the coated substrate body.

5. The method according to claim 1 the blast agent is trained substantially perpendicularly onto the substrate body surface by compressed air at a pressure of BX10⁵ Pa to 7×10⁵ Pa.

6. The method according to claim 1 wherein the blast treatment is carried out for a duration sufficient to effect a reduction of the internal tensile stress increasing the compressive stress or minimizing the tensile stress also for a region lying below an outer layer or an outermost layer and in a zone close to the surface of the substrate body.

7. A cutting insert for machining comprised of a hard metal substrate body, a cermet substrate body or a ceramic substrate body with a single layer or multilayer coating of carbides, nitrides, carbonitrides, oxycarbonitrides and/or borides of the elements of groups IVa to VIa of the periodic system, boron-containing hard material compounds and/or oxidic compounds of aluminum and/or zirconium which are applied by a PCVD process or a CVD process wherein the compressive residual stress in the outer or outermost layer is 4.5 to 10 Gpa provided by training a spray formed hard metal granulate composed of round grains of a particle size of 5 to 50 μm in a compressed air stream at a pressure of 6×10⁵ Pa to 7×10⁵ Pa perpendicularly against said coating.

8. The cutting insert according to claim 7 wherein the substrate body is comprised of a hard metal with a hard material composition or hard material content changing toward its edge zones proximal to its surface.

9. The cutting insert according to claim 7 wherein the substrate body is an oxide ceramic or nitride ceramic.

10. The cutting insert according to claim 7 wherein the layer thickness of an individual layer is at least 0.1 μm and the total layer thickness is ≦10 μm.

* * * * *